United States Patent
Kalnitsky et al.

(10) Patent No.: US 8,000,139 B2
(45) Date of Patent: *Aug. 16, 2011

(54) MULTIPLE TIME PROGRAMMABLE (MTP) PMOS FLOATING GATE-BASED NON-VOLATILE MEMORY DEVICE FOR A GENERAL PURPOSE CMOS TECHNOLOGY WITH THICK GATE OXIDE

(75) Inventors: Alexander Kalnitsky, San Francisco, CA (US); Michael D. Church, Sebastian, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/430,007

(22) Filed: Apr. 24, 2009

(65) Prior Publication Data

US 2009/0207655 A1    Aug. 20, 2009

Related U.S. Application Data

(63) Continuation of application No. 11/508,771, filed on Aug. 23, 2006, now Pat. No. 7,542,342, which is a continuation-in-part of application No. 11/498,672, filed on Aug. 2, 2006, now abandoned.

(60) Provisional application No. 60/793,770, filed on Apr. 21, 2006.

(51) Int. Cl.
*G11C 16/04* (2006.01)
(52) U.S. Cl. .................................. 365/185.06; 365/149
(58) Field of Classification Search ............. 365/185.06, 365/149, 185.27, 185.23
See application file for complete search history.

(56) References Cited

U.S. PATENT DOCUMENTS

| | | |
|---|---|---|
| 4,432,072 A | 2/1984 | Chao et al. |
| 4,611,309 A | 9/1986 | Chuang et al. |
| 4,655,601 A | 4/1987 | Suzuki |
| 4,672,580 A | 6/1987 | Yau et al. |
| 5,465,231 A | 11/1995 | Ohsaki |
| 5,719,427 A | 2/1998 | Tong et al. |
| 5,790,455 A * | 8/1998 | Caywood ............... 365/185.06 |
| 5,880,991 A | 3/1999 | Hsu et al. |
| 5,923,589 A | 7/1999 | Kaida |
| 5,981,335 A | 11/1999 | Chi |
| 6,025,625 A | 2/2000 | Chi |
| 6,055,185 A | 4/2000 | Kalnitsky et al. |
| 6,064,595 A | 5/2000 | Logie et al. |
| 6,081,451 A | 6/2000 | Kalnitsky et al. |
| 6,100,560 A | 8/2000 | Lovett |
| 6,118,691 A | 9/2000 | Kalnitsky et al. |
| 6,122,204 A | 9/2000 | Poplevine et al. |
| 6,130,840 A | 10/2000 | Bergemont et al. |

(Continued)

*Primary Examiner* — Vu A Le
(74) *Attorney, Agent, or Firm* — Fogg & Powers LLC

(57) ABSTRACT

A multiple time programmable (MTP) memory cell, in accordance with an embodiment, includes a floating gate PMOS transistor, a high voltage NMOS transistor, and an n-well capacitor. The floating gate PMOS transistor includes a source that forms a first terminal of the memory cell, a drain and a gate. The high voltage NMOS transistor includes a source connected to ground, an extended drain connected to the drain of the PMOS transistor, and a gate forming a second terminal of the memory cell. The n-well capacitor includes a first terminal connected to the gate of the PMOS transistor, and a second terminal forming a third terminal of the memory cell. The floating gate PMOS transistor can store a logic state. Combinations of voltages can be applied to the first, second and third terminals of the memory cell to program, inhibit program, read and erase the logic state.

12 Claims, 4 Drawing Sheets

U.S. PATENT DOCUMENTS

| | | | |
|---|---|---|---|
| 6,137,721 A | 10/2000 | Kalnitsky et al. | |
| 6,137,722 A | 10/2000 | Kalnitsky et al. | |
| 6,137,723 A | 10/2000 | Bergemont et al. | |
| 6,137,724 A | 10/2000 | Kalnitsky et al. | |
| 6,141,246 A | 10/2000 | Derman et al. | |
| 6,157,574 A | 12/2000 | Kalnitsky et al. | |
| 6,222,764 B1 | 4/2001 | Kelley et al. | |
| 6,271,560 B1 | 8/2001 | Kalnitsky et al. | |
| 6,278,635 B1 | 8/2001 | Hara | |
| 6,512,691 B2 | 1/2003 | Hsu et al. | |
| 6,512,700 B1 | 1/2003 | McPartland et al. | |
| 6,566,683 B1 | 5/2003 | Ogawa et al. | |
| 6,617,637 B1 | 9/2003 | Hsu et al. | |
| 6,747,890 B1 | 6/2004 | Kirihata et al. | |
| 6,795,347 B2 * | 9/2004 | Ausserlechner et al. | 365/185.28 |
| 6,812,083 B2 | 11/2004 | Shen et al. | |
| 6,965,142 B2 | 11/2005 | Diorio et al. | |
| 7,099,192 B2 | 8/2006 | Wang et al. | |
| 7,205,598 B2 | 4/2007 | Voshell et al. | |
| 7,283,390 B2 | 10/2007 | Pesavento | |
| 7,333,362 B2 | 2/2008 | Gendrier et al. | |
| 7,397,078 B2 | 7/2008 | De Zaldivar | |
| 7,449,754 B2 | 11/2008 | Moore | |
| 2002/0121654 A1 | 9/2002 | Yamamoto | |
| 2006/0067124 A1 * | 3/2006 | Lee et al. | 365/185.11 |
| 2006/0281247 A1 | 12/2006 | De Zaldivar | |
| 2007/0121381 A1 | 5/2007 | Kalnitsky et al. | |
| 2007/0247915 A1 | 10/2007 | Kalnitsky et al. | |
| 2008/0266959 A1 | 10/2008 | Haggag et al. | |

\* cited by examiner

MULTIPLE TIME PROGRAMMABLE (MTP) PMOS FLOATING GATE-BASED NON-VOLATILE MEMORY DEVICE FOR A GENERAL PURPOSE CMOS TECHNOLOGY WITH THICK GATE OXIDE

This application is a continuation of U.S. patent application Ser. No. 11/508,771, filed Aug. 23, 2006, which is a continuation-in-part of U.S. patent application Ser. No. 11/498,672, filed Aug. 2, 2006. Both of the '771 and '672 applications claim priority under 35 U.S.C. §119(e) to U.S. Provisional Patent Application No. 60/793,770, filed Apr. 21, 2006. All of the foregoing applications are incorporated herein by reference.

FIELD

Embodiments of the present invention relate to multiple time programmable (MTP) memory devices

BACKGROUND

U.S. Pat. No. 6,271,560, which is incorporated herein by reference, teaches the use of a floating gate avalanche PMOS (FAMOS) device structure programmable with CMOS compatible voltages as a non-volatile storage element. The floating gate PMOS is placed in series with an NMOS transistor which serves as a write enable switch.

U.S. Pat. No. 6,157,574, which is incorporated herein by reference, teaches the use of the FAMOS device structure programmable with CMOS compatible voltages in a multiple time programmable (MTP) mode by adding a floating gate poly-poly coupling capacitor to enable the erase operation. An erase operation is carried out by application of a negative voltage pulse to the poly-2 plate of the coupling capacitor. Alternatively, an erase operation can be accomplished by application of the high positive voltage to the n-well housing the floating gate device.

U.S. Pat. No. 6,137,723, which is incorporated herein by reference, teaches the use a gate oxide to p-well coupling capacitor for an erase operation. This approach requires an additional isolating well (3rd well) to isolate the negative cell erase voltage (applied to the p-well) from the substrate (which is typically p-type in CMOS technologies). Alternatively, an erase operation can be accomplished by application of the high positive voltage to the n-well housing the floating gate device. Application of high positive erase voltage to the n-well containing the FAMOS device in series with the access transistor is limited to voltages that are lower than the junction breakdown of the P+N diode or the gate oxide breakdown (PMOS access device) or the series combination of the P+N and N+P diodes (NMOS access device). This limits the applicability of existing cells for the MTP use to relatively thin (less than 10 nm, 3.3V I/O devices) gate oxides requiring less than ~12V erase voltage.

Since many CMOS technologies use and will continue to use 5V I/O devices with gate dielectric thickness in the 10-15 nm range (which would require erase voltages of ~12V to ~18V), there is a clear need for a MTP device that is capable of withstanding high positive erase voltages.

SUMMARY

Embodiments of the present invention are directed to multiple time programmable (MTP) memory cells. In accordance with an embodiment of the present invention, an MTP memory cell includes a floating gate PMOS transistor, a high voltage NMOS transistor, and an n-well capacitor. The floating gate PMOS transistor includes a source that forms a first terminal of the memory cell, a drain and a gate. The high voltage NMOS transistor includes a source connected to ground, an extended drain connected to the drain of the PMOS transistor, and a gate forming a second terminal of the memory cell. The n-well capacitor includes a first terminal connected to the gate of the PMOS transistor, and a second terminal forming a third terminal of the memory cell. The floating gate PMOS transistor can store a logic state. Combinations of voltages can be applied to the first, second and third terminals of the memory cell to program, inhibit program, read and erase the logic state stored by the floating gate PMOS transistor.

In accordance with specific embodiments, the gate of the floating gate PMOS transistor is formed on a gate oxide layer having a thickness in the range of 10 nm to 15 nm, and preferably at least 12 nm.

The gate of the high voltage NMOS transistor is formed on a gate oxide layer. In accordance with an embodiment of the present invention, to produce the high voltage NMOS transistor, the extended drain of the high voltage NMOS transistor is isolated from the gate oxide of the high voltage NMOS transistor by a field oxide region or a dielectric region.

In accordance with an embodiment of the present invention, the floating gate transistor used to store a logic state (also referred to as the memory transistor) includes a well of a first conductivity type (e.g., an n-well) formed in a substrate material (e.g., a p-type substrate), a layer of gate oxide grown on the n-well and a layer of polysilicon that forms the floating gate over the oxide. Spaced apart source and drain regions of a second conductivity type (e.g., p+ regions) formed in the well by means of ion implantation that also dopes the floating gate poly p+. A channel region is formed between the source and drain regions, a layer of gate oxide is formed over the channel region, and a floating gate is formed over the layer of gate oxide.

In accordance with an embodiment, the high voltage transistor, which is used to access the memory transistor, is also formed in the substrate. More specifically, the high voltage transistor includes both a first well of the first conductivity type (e.g., an n-well) and a second well of a second conductivity type (e.g., a p-well) formed in the substrate material. The drain of the high voltage transistor is formed by the first well, and the source of the high voltage transistor is formed in the second well. The channel region is defined between the source and drain regions, with the channel being in the second well. A layer of gate oxide is formed over the channel, with the gate formed over the layer of gate oxide. A silicide layer is formed over the drain region (more specifically, over an ohmic tie to the drain region), the gate and the source-substrate tie regions, to form a contact surface. An isolating material isolates the silicide layer from the gate. In accordance with an embodiment, the isolating material is a field oxide at least partially formed in the first well. In another embodiment, the isolating material is a dielectric formed on a portion of the first well, e.g., using a masking operation.

In accordance with an embodiment, the capacitor, for coupling the gate of the memory transistor to ground, includes a well of the first conductivity type (e.g., an n-well) formed in the substrate, a gate oxide grown on the well and the gate polysilicon layer deposited over the gate oxide to form the coupling capacitor top plate. Spaced apart first and second diffusion regions (e.g., N+ regions), i.e., well taps, are formed by means of ion implantation that also dopes the polysilicon. This embodiment provides part of the floating gate (storage element) that is doped P+ and another part of the floating gate (control gate) that is doped N+, with the two being shorted by e.g. by silicide over the field oxide.

In accordance with another embodiment, the coupling capacitor is formed in an n-well, a gate oxide grown over the well and the gate polysilicon layer is deposited over the gate oxide to form the capacitor top plate. Spaced apart first and second diffusion regions (e.g. P+ regions) are formed by ion implantation that also dopes the polysilicon gate. An N+tap contact (shorted to the P+ diffusion by silicide or metal with contacts provided to both the P+ and the N+ regions) is also provided to contact the n-well. This embodiment provides P+ doped floating gate disposed over both n-well regions.

In accordance with yet another embodiment, the coupling capacitor is formed between the gate poly and the second poly layer if such is available in the process.

This summary is not intended to be a complete description of the embodiments of the present invention. Further and alternative embodiments, and the features, aspects, and advantages of the present invention will become more apparent from the detailed description set forth below, the drawings and the claims.

DETAILED DESCRIPTION

Figure 1:
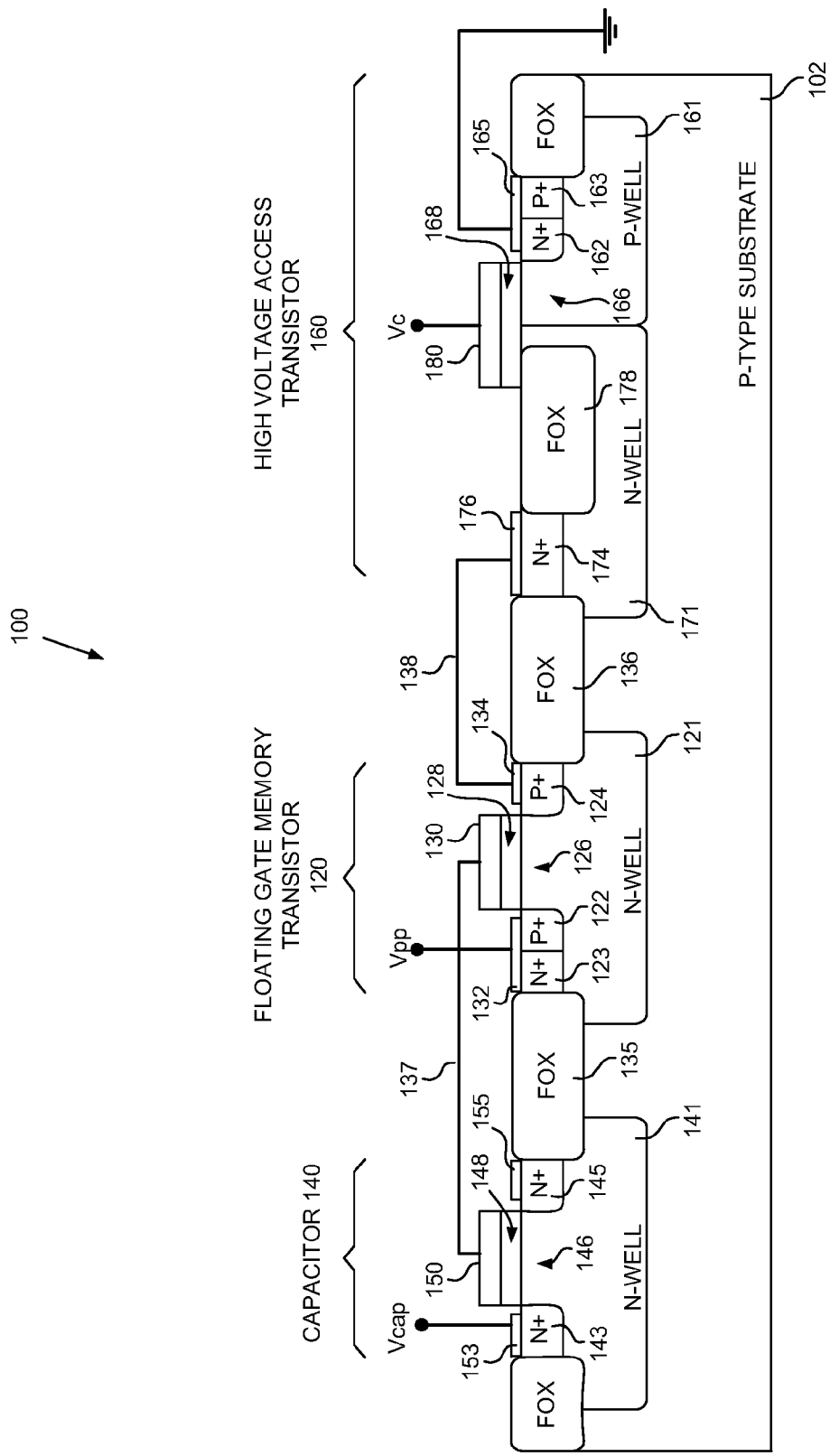
FIG. 1 illustrates a multiple time programmable (MTP) memory device according to an embodiment of the present invention.

FIG. 1 shows a cross section of a multiple time programmable (MTP) PMOS floating-gate based non-volatile memory cell 100. As shown in FIG. 1, the MTP memory cell 100 includes a memory transistor 120, a coupling capacitor 140 and a high voltage access transistor 160.

The memory transistor 120 includes spaced apart p-type source and drain regions 122 and 124, respectively, which are formed in an n-type well 121 (n-well). The n-type well 121 is in turn formed in a p-type substrate 102. A channel region 126 is defined between the source region 122 and the drain region 124. A layer of gate oxide 128 is formed over the channel region 126, and a poly silicon gate 130 is formed over the gate oxide 128. Since the gate 130 is isolated, it is often referred to as a floating gate. An n-type region 123 is also formed within the n-type well 121, next to (likely touching, but not necessarily touching) the p-type source region 122. The n-type region 123 provides an ohmic body tie to the n-well 121, so the n-well 121 is tied to a Vpp terminal (if absent, the n-well 121 would float). A layer of silicide 132 is formed over the p-type and n-type regions 122 and 123, to thereby form a contact region for the Vpp terminal. A layer of silicide 134 is also formed over the p-type drain region 124. Customary side wall spacers used in modern CMOS technologies to space source/drain implants from the gate and to prevent diffusion to gate silicide shorts can be used, but for simplicity, are not shown in the drawings. The gate 130 can optionally be covered with silicide or can have silicide formation excluded from this region by conventional (silicide block) means. In the embodiment shown, the memory transistor 120 is a floating gate PMOS transistor. The memory transistor 120 may also be referred to as a storage transistor, because it can be programmed to store a logic state.

The capacitor 140 includes spaced apart N-type diffusion regions 143 and 145 (also known as well taps) formed within an n-type well 141, which is formed in the p-type substrate 102. A channel region 146 is defined between the N-type regions 143 and 145, a layer of gate oxide 148 is formed over the channel region 146, and a poly silicon gate 150 is formed over the gate oxide 148 to form the coupling capacitor top plate. A layer of silicide 153 is formed over the n-type region 143, and a layer of silicide 155 is formed over the n-type region 145. A field oxide (FOX) region 135, e.g., formed using a shallow trench isolation (STI) process, local oxidation of silicon (LOCOS) process, poly buffer LOCOS process, etc., isolates the coupling capacitor 140 from the memory transistor 120. In the embodiment shown, the capacitor 140 is a depletion NMOS device, and can also be referred to as an n-well capacitor. A further field oxide (FOX) region 136 isolates the high voltage access transistor 160 from the memory transistor 120. A p-well 192 preferably electrically isolates the n-well 141 from the n-well 121, without contacting either n-well 141 or 121. Similarly, a p-well 194 preferably electrically isolates the n-well 121 from the n-well 171, preferably without contacting either n-well 121 or 171. The inclusion of the p-wells 192 and 194 allows for application of higher voltages by preventing punch-thru between the neighboring n-wells 141 and 121, and neighboring n-wells 121 and 171. Because of their function, the p-wells 192 and 194 can be referred to as isolation wells.

A P+ doped gate 130 of the memory transistor 120 and an N+ doped gate 150 of the coupling capacitor device may be optionally protected by a salicide exclusion block to improve the cell retention time. If this approach is taken the N+ and the P+ doped regions of the floating gate can be strapped by a silicide outside the active device areas.

Figure 2:
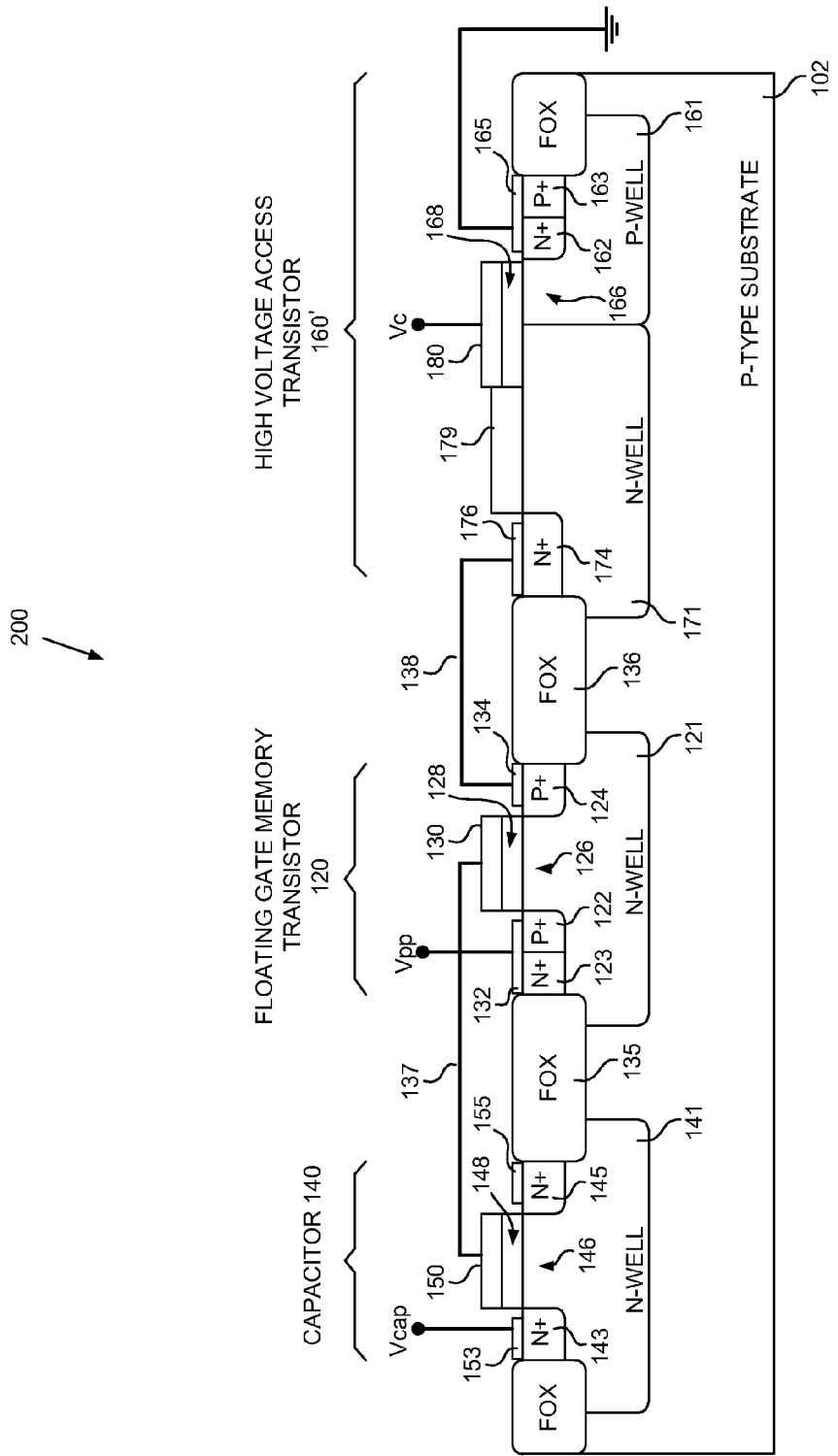
FIG. 2 illustrates a multiple time programmable (MTP) memory device according to another embodiment of the present invention.
Figure 6:
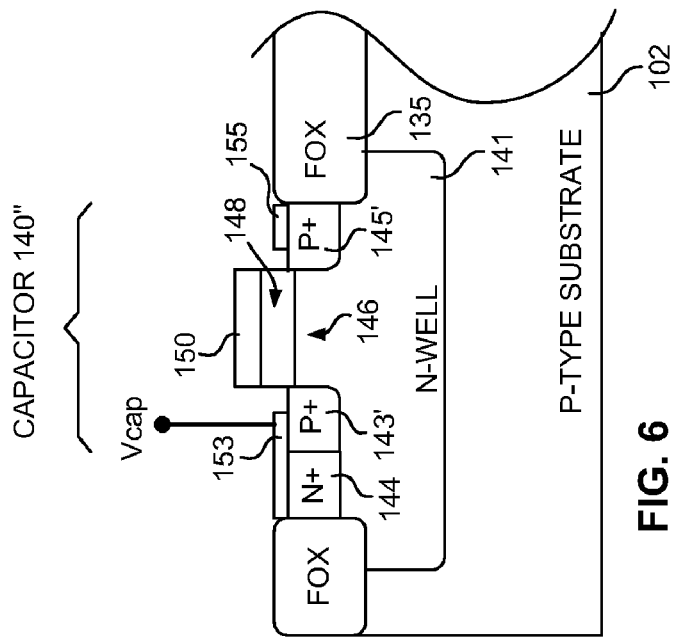
FIGS. 5 and 6 illustrate alternative coupling capacitors that can be used with the embodiments of FIGS. 1 and 2.
Figure 5:
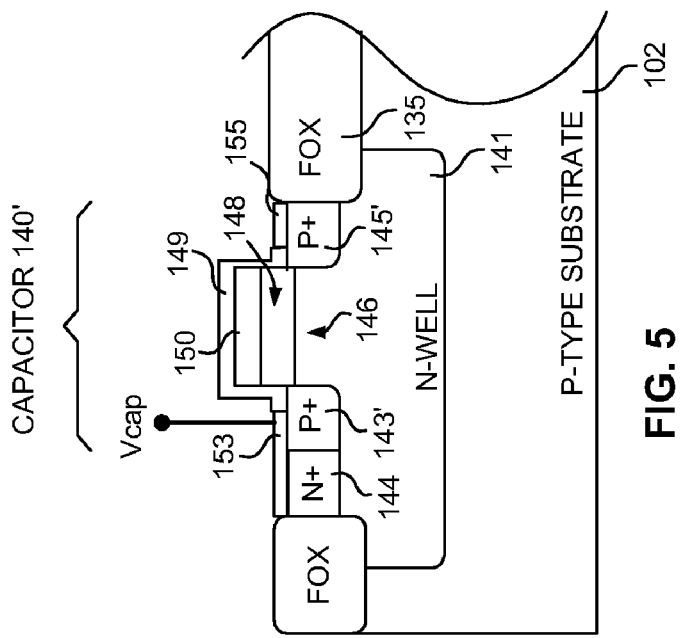

Alternative capacitors 140' and 140", for use in the embodiment of FIGS. 1 and 2, are shown in FIGS. 5 and 6. Referring to FIG. 5, the capacitor 140' includes spaced apart P-type diffusion regions 143' and 145' formed within the n-type well 141, which the formed in the p-type substrate 102. An additional N+ region 144 is provided as an ohmic contact to the n-well 141. The layer of silicide 153 is formed over the n-type region 144 and the p-type region 143', and the layer of silicide 155 is formed over the p-type region 145' to short these two regions. In the embodiment of FIG. 5, the capacitor 140 is an enhancement PMOS device, and can also be referred to as an n-well capacitor.

The P+ doped gate region 130 of the memory transistor 120 and the P+ doped gate region 150 of the coupling capacitor device may be optionally protected by a salicide exclusion block to improve the cell retention time. FIG. 5 shows such a salicide exclusion block at 149. FIG. 6 is similar to FIG. 5, but does not include the salicide exclusion block 149.

The high voltage access transistor 160 includes both a p-type well 161 (p-well) and an n-type well 171 (n-well). The n-well 171 forms the drain of the transistor 160, with an n-type region 174 providing an ohmic body tie to a silicide contact region 176. An n-type source region 162 is formed in the p-type well 161. A channel region 166 is defined between the n-type source region 162 and the n-type well drain region 171. A layer of gate oxide 168 is formed over part of the p-well and part of the n-well 171 (including where they abut one another), and a poly silicon gate 180 is formed over the gate oxide 168, resulting in the gate 180 being over the channel 166. A p-type region 163 is also formed within the p-type well 161, next to (likely touching, but not necessarily touching) the n-type source region 162. The p-type region 163 provides an ohmic body tie to the p-well 161 so the p-well 121 is tied to ground (if absent, the p-well 161 would float). It is noted that explaining that a terminal is connected or tied to ground is also meant to encompass such a terminal connected or tied to a voltage that is very close to ground, but slightly offset from ground. A layer of silicide 165 is formed over the n-type and p-type regions 162 and 163, to thereby form a contact region that is shown as being connected to ground. The layer of silicide 176 is formed over the n-type region 174. A field oxide (FOX) region 178 is formed in the n-well 171 to isolate the silicide contact region 176 (which is the contact for the drain 171) from the gate 180. It is this isolation that enables the access transistor 160 to withstand the higher voltages which occur during an erase operation.

In the embodiment shown, the high voltage access transistor 160 is a high voltage NMOS device. The high voltage access transistor 160 may also be referred to as a high voltage select transistor. Because of its extended drain 171, the access transistor 160 can also be referred to as a high voltage extended drain NMOS transistor.

The above mentioned silicide regions 132, 134, 153, 155, 165 and 176 provide low resistance contact regions to the silicon. Such regions are generally self aligned, meaning that any non-dielectric region of exposed silicon will be silicided. Additionally, the gate 180 will likely be silicided, but for simplicity this is not shown, and is not important to the embodiments of the present invention. In accordance with preferred embodiments of the present invention, the gates 130 and 150 are specifically not silicided, to prevent possible charge leakage from the gates to the corresponding source and drain regions and thus improve retention characteristics of the cell. Nevertheless, embodiments where the gate 150 is silicided are also possible, although less preferred.

In accordance with embodiments of the present invention, each gate oxide layer 128, 148 and 168 preferably has a gate oxide thickness that is the same as the gate oxide thickness of CMOS devices that are used as input/output interface devices having an operating voltage of 5V. In other words, the thickness for gate oxide layers 128, 148 and 168 is preferably native to the fabrication process for 5V I/O devices. This enables devices 120, 140 and 160 to be made using standard CMOS processes. More specifically, in accordance with embodiments of the present invention, each gate oxide layer 128, 148 and 168 has a thickness in the range of 10-15 nm (i.e., 100-150 A). Preferably, the thickness of each gate oxide layer 128, 148 and 168 is at least 12 nm (i.e., at least 120 A). It is believed that embodiments of the present invention will work with a gate oxide thickness up to about 20 nm (i.e., 200 A), enabling such embodiments to be useful with devices having even higher I/O voltages.

The top plate (gate 150) of the n-well capacitor 140 is electrically connected to the gate 130 of the memory transistor, e.g., by a trace 137. There is no contact to the floating gate 130 of the memory transistor 120. The capacitor 140 capacitively couples the floating gate 130 to ground (which need not be exactly 0V), so that when a high erase voltage (e.g., 14-20V) is applied to the Vpp terminal, electrons are tunneled off the floating gate 130. As also shown in FIG. 1, the p-type drain region 124 of the memory transistor 120 is electrically connected to the n-type drain region 171 (through the ohmic body tie 174) of the high voltage access transistor 160, e.g., by a trace 138.

In accordance with embodiments of the present invention, the MTP memory cell includes three terminals. A capacitor terminal (Vcap) is formed by the n-type diffusion region 143 of the n-well capacitor 140. A program terminal (Vpp) is formed by the p-type source region 122 of the memory transistor 120. A control terminal (Vc), also referred to as a select or access terminal, is formed by the gate 180 of the high voltage access transistor 160.

Table 1, shown below, is used to summarize the operation of the MTP memory cell 100.

TABLE 1

| Operation | Vpp (V) | Vc (V) | Vcap(V) |
|---|---|---|---|
| Program | ~5-10 V | ~5 V | ~5 V |
| Inhibit Program | ~0-10 V | 0 V | Don't Care |
| Read | ~1 V | ~5 V | 0 V |
| Erase | ~14-20 V | 0 V | 0 V |

To program the MTP memory cell, a program voltage level should be applied to the Vpp terminal, and a select voltage level should be applied to the Vc terminal and the Vcap terminal. The select voltage should be sufficient to turn on the access transistor 160. The program voltage level should be sufficient to induce channel punch-thru in the floating gate PMOS memory transistor 120. The punch through current in turn generates hot electrons that are injected on the floating gate 130 and trapped there to turn on the PMOS memory transistor 120.

The Vpp voltage may be externally applied or generated on chip. Increasing Vpp may shorten the time needed to program the cell. The magnitude of Vpp will also be a function of the length of the channel 126 of the floating gate memory transistor 120.

To inhibit programming of the cell 100, the Vc terminal should be connected to GND. The memory cell 100 can be read by applying a significantly lower read voltage (e.g., approximately 1V), to the Vpp terminal, while the Vc terminal receives the select voltage level.

To erase the memory cell 100, an erase voltage that is likely at least twice the program voltage level should be applied to the Vpp terminal, while the Vc terminal and the Vcap terminal are connected to GND. Thus, in accordance with specific embodiments, the Vpp terminal is used for both programming the memory cell 100, and erasing the memory cell 100. In accordance with specific embodiments of the present invention, the program voltage level is approximately 5-10V and the erase voltage level is approximately 14-20V. The erase operation will result in the simultaneous erasure of all cells connected to the common Vpp bus. In accordance with specific embodiments, the select voltage level is approximately 5V.

The high voltage NMOS access transistor 160 in FIG. 1 is made from elements that are native to a CMOS device, i.e., an n-well, p-well, FOX, source, drain, gate oxide and gate. However, this need not be the case, as described below.

FIG. 2 illustrates an MTP memory cell 200, in accordance with an alternative embodiment of the present invention, where an alternative high voltage NMOS access transistor 160' is used. Since a majority of the elements in FIGS. 1 and 2 are the same, common reference numbers are used to indicate common elements. The significant difference between memory cell 200 and memory cell 100 is that the high voltage access transistor 160' in FIG. 2 does not include the FOX region 178 to isolate the silicide region 176 (and thus the drain 174) from the gate oxide 168 and the portion of the channel 166 within the p-well 161, but rather includes the dielectric region 179 for that same purpose. The dielectric region 179 can be, e.g., silicon dioxide or silicon nitride, but is not limited thereto. While the dielectric 179 may be native to the fabrication process, a masking operation used to form the dielectric 179 may not be native. The same masking step used to prevent silicide from forming on gates 130 and 150 can also be used to pattern the dielectric 179.

As explained above, embodiments of the present invention use a high voltage transistor (e.g., 160 or 160') as the access transistor. As mentioned above, to erase the cells 100/200, a relatively high voltage (e.g., approximately 15V) is applied to the Vpp terminal, to form a voltage drop across the gate oxide 128 of the memory device sufficient for the Fowler-Nordheim tunneling. However, in the case of the access transistor 160/160', the high voltage is applied across the series connection of the diode formed by the n-well 121 and P+ region 124 of the memory transistor 120, and the diode formed by the N+ region 174, n-well 171 and p-well 161 of the access transistor 160. The standard MOS transistors inherent in the fabrication process would not be able to withstand such high erase voltages. This is why high voltage transistors 160/160' are used as access transistors. More specifically, during erase, the access transistor is turned off, causing a relatively high voltage (e.g., 15V) to appear at the extended lightly doped drain 171 of the access transistor 160/160'. For the access transistor 160/160' to function, some of the voltage must be dropped in the silicon before the current reaches the channel 166 in the p-well 161. If the silicide 176 extended all the way to the gate oxide layer 168, then all the current would go through the silicide 176 (because of its low resistance) and there would be little voltage drop. By breaking the silicide prior to the channel 166 in the p-well 161 (using FOX 178 in FIG. 1, or dielectric 179 in FIG. 2), the current is forced into the relatively high resistance silicon. By designing the length of the un-silicided region properly, the voltage at the edge of the portion of the channel 166 within the p-well 161 is relatively low (e.g., to 5V) compared to the drain voltage during an erase operation.

A high voltage MOS transistor, as the term is used herein, is a transistor capable of sustaining (without breakdown) a higher voltage on at least one terminal (e.g., the drain) than the standard NMOS and/or PMOS transistors inherent in a fabrication process. Two different types of high voltage NMOS access transistors (160 and 160') were described above. One of ordinary skill in the art would understand that the use of alternative types of high voltage NMOS (or PMOS) devices as an access transistor for a floating gate based non-volatile memory cell are also within the scope of the present invention, and thus, that embodiments of the present invention are not limited to the two devices disclosed herein.

Figure 3:
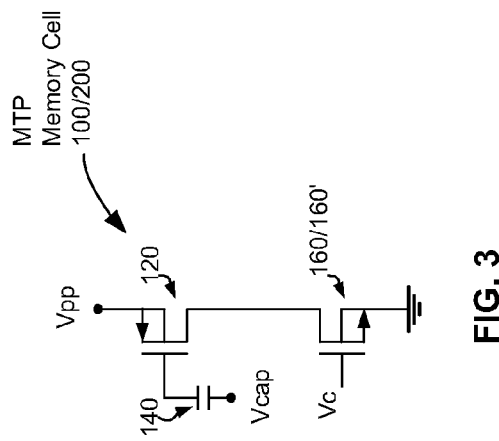
FIG. 3 is a schematic diagram of the MTP memory devices shown in FIGS. 1 and 2.

FIG. 3 is schematic representation of the MTP memory cells 100/200 of the present invention. Shown in FIG. 3 is the floating gate PMOS memory transistor 120, the high voltage NMOS access transistor 160/160', and the n-well CMOS capacitor 140. The floating gate PMOS transistor 120 includes a source that forms the Vpp terminal, a drain connected to a drain of the high voltage NMOS access transistor 160/160', and a floating gate connected to one terminal of the n-well CMOS capacitor 140. The other terminal of the n-well CMOS capacitor forms the Vcap terminal. The high voltage NMOS access transistor 160/160' has a source that is connected to ground, a drain connected to the drain of the floating gate PMOS memory transistor 120 (as just mentioned above), and a gate that forms the Vc terminal.

Figure 4:
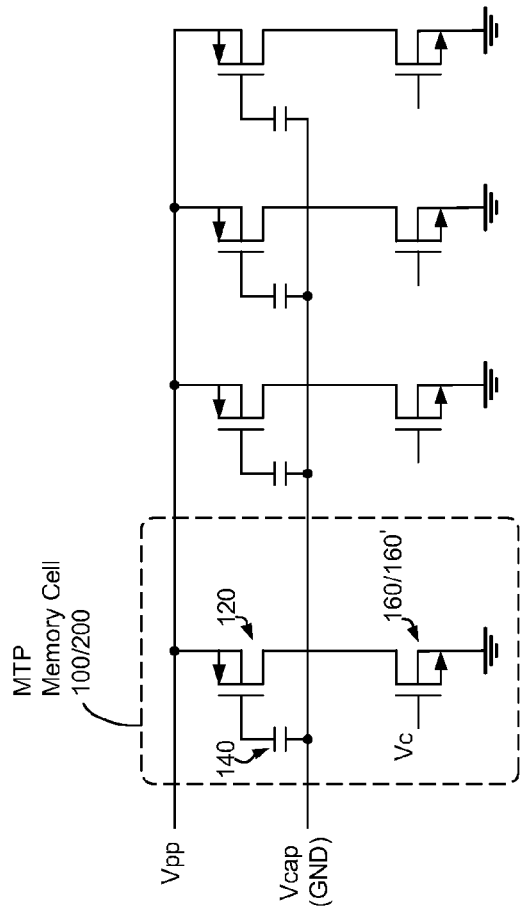
FIG. 4 illustrates how the MTP memory devices of the present invention can be organized in an array.

FIG. 4 illustrates how the MTP memory devices of the present invention can be organized in an array or row (which can be a page, or portion thereof). As shown, the Vpp terminals of the cells 100/200 in a row are connected together, e.g., by a Vpp bus or a page line. Additionally, the Vcap terminals of the cells 100/200 in a row are connected together. In contrast, the Vc terminals of the cells 100/200 are not connected together. To program a single cell within a row, the program voltage level (e.g., approximately 7V) is applied to the Vpp terminal, and the select voltage level (e.g., approximately 5V) is applied to the Vc terminal and Vcap terminal of the cell 100/200 to be programmed, while the Vc terminal of all cells not being programmed should be connected to ground. If the desire is to program multiple cells 100/200 at once (i.e., cells in parallel), then the select voltage level can be applied to more than one cell 100/200 in a row. Cells 100/200 can be programmed sequentially, by sequentially applying the select voltage levels to the Vc terminals and Vcap terminals of the row.

As is known in the art, a sense amplifier (not shown) can be used to read the contents of a cell by sensing the voltage at the drain of the PMOS memory transistor 120 of a cell 100/200, while the read voltage level (e.g., approximately 1V) is applied to the Vpp terminal of that cell. More than one cell 100/200 can be read at a time, e.g., entire rows or pages can be read at one time. The drain of a transistor of the sense amplifier will need to withstand high voltages, and thus, can be formed in a similar manner as access transistors 160/160' (but may have smaller dimensions because of lower current requirements).

Multiple rows of the cells 100/200 can be placed in parallel such that multiple columns of the cells 100/200 are also formed. The Vpp bus associated with a row would thereby act as a row or page select bus. The Vc terminals of each cell 100/200 in a column can be connected together, to form a column select bus.

Additional exemplary details of how arrays of memory cells can be configured, programmed and read are disclosed in U.S. Pat. Nos. 6,055,185, 6,081,451, 6,118,691, 6,122,204, 6,130,840, 6,137,721, 6,137,722, 6,137,723, 6,137,724, 6,141,246 and 6,157,574, each of which are incorporated herein by reference.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Unless otherwise specified, alternate boundaries can be defined so long as the specified functions and relationships thereof are appropriately performed. Any such alternate boundaries are thus within the scope and spirit of the claimed invention.

The breadth and scope of the present invention should not be limited by any of the above-described exemplary embodiments, but should be defined only in accordance with the following claims and their equivalents.

What is claimed is:

1. A memory cell comprising:
    a floating gate NMOS transistor including a source that forms a first terminal of the memory cell, a drain, and a gate;
    a high voltage PMOS transistor including a source, an extended drain connected to the drain of the floating gate transistor, and a gate forming a second terminal of the memory cell; and a capacitor including a first terminal connected to the gate of the floating gate transistor, and a second terminal forming a third terminal of the memory cell;

wherein the floating gate transistor can store a logic state; and wherein combinations of voltages can be applied to the first, second, and third terminals of the memory cell to program, inhibit program, read, and erase the logic state stored by the floating gate transistor;

wherein to program the cell a program voltage is applied to the first terminal, and a select voltage is applied to the second and third terminals;

to inhibit programming of the cell the second terminal is connected to ground;

to read the cell a read voltage is applied to the first terminal, a select voltage is applied to the second terminal, and the third terminal is connected to ground; and to erase the cell an erase voltage is applied to the first terminal, and the second and third terminals are connected to ground.

2. The memory cell of claim 1, wherein the erase voltage is at least twice the program voltage.

3. The memory cell of claim 1, wherein:
the program voltage is about 5-10 volts;
the read voltage is about 1 volt; and
the erase voltage is about 14-20 volts.

4. A method for operating a memory cell that comprises:
a floating gate transistor including a source that forms a first terminal of the memory cell, a drain, and a gate;
a high voltage transistor including a source, an extended drain connected to the drain of the floating gate transistor, and a gate forming a second terminal of the memory cell; and
a capacitor including a first terminal connected to the gate of the floating gate transistor, and a second terminal forming a third terminal of the memory cell;

the method comprising:
programming the memory cell by applying a program voltage to the first terminal of the memory cell and a select voltage to the second and third terminals of the memory cell;
inhibiting programming of the memory cell by connecting the second terminal of the memory cell to ground;
reading the memory cell by applying a read voltage to the first terminal of the memory cell, applying a select voltage to the second terminal of the memory cell, and connecting the third terminal to ground; and
erasing the memory cell by applying an erase voltage to the first terminal of the memory cell and connecting the second and third terminals of the memory cell to ground.

5. The method claim 4, wherein the source of the high voltage transistor is connected to ground.

6. The method of claim 4, wherein the erase voltage is at least twice the program voltage.

7. The method of claim 4, wherein:
the program voltage is about 5-10 volts;
the read voltage is about 1 volt; and
the erase voltage is about 14-20 volts.

8. The memory cell of claim 1, wherein the source of the high voltage transistor is connected to ground.

9. The memory cell of claim 1, wherein the gate of the floating gate transistor is on a gate oxide layer having a thickness in the range of about 10 nm to about 15 nm.

10. The memory cell of claim 1, wherein the gate of the floating gate transistor is on a gate oxide layer having a thickness of at least 12 nm.

11. The memory cell of claim 1, wherein:
the gate of the floating gate NMOS transistor is unsilicided; and
the capacitor includes a gate that is unsilicided.

12. The memory cell of claim 1, wherein:
the gate of the floating gate NMOS transistor is unsilicided; and
the capacitor includes a gate that is silicided.

* * * * *